(12) United States Patent
Ham

(10) Patent No.: US 9,508,416 B2
(45) Date of Patent: Nov. 29, 2016

(54) POWER-UP SIGNAL GENERATION CIRCUIT

(71) Applicant: SK hynix Inc., Gyeonggi-do (KR)

(72) Inventor: Hyun-Ju Ham, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 14/484,022

(22) Filed: Sep. 11, 2014

(65) Prior Publication Data

US 2015/0244356 A1 Aug. 27, 2015

(30) Foreign Application Priority Data

Feb. 25, 2014 (KR) .................. 10-2014-0021933

(51) Int. Cl.
*H03L 7/00* (2006.01)
*G11C 11/4072* (2006.01)
*H03K 17/22* (2006.01)

(52) U.S. Cl.
CPC ......... *G11C 11/4072* (2013.01); *H03K 17/223* (2013.01)

(58) Field of Classification Search
CPC .................................................. G11C 11/4072
See application file for complete search history.

(56) References Cited

U.S. PATENT DOCUMENTS 5,808,516 A 9/1998 Barber
2009/0256599 A1* 10/2009 Shinomiya ........... H03K 17/223
327/143

FOREIGN PATENT DOCUMENTS

| KR | 1020020095913 | 12/2002 |
| KR | 1020050046070 | 5/2005 |
| KR | 1020100076747 | 7/2010 |

* cited by examiner

*Primary Examiner* — Daniel Puentes
(74) *Attorney, Agent, or Firm* — IP & T Group LLP

(57) ABSTRACT

A power-up signal generation circuit includes a control signal generation unit suitable for generating first and second control voltages based on a power-up signal, a level tracing voltage generation unit suitable for generating a level tracing voltage whose voltage level varies based on the first and second control voltages, and a power-up signal generation unit suitable for generating the power-up signal based on the level tracing voltage, and providing a feedback on the power-up signal to the control signal generation unit.

16 Claims, 6 Drawing Sheets

| | BEFORE POWER-UP | AFTER POWER-UP |
|---|---|---|
| VCTRL1 | VSS | VDD |
| VCTRL2 | VDD | VSS |
| R1 | R1(min) | R1(min) - {R1(delta)*VDD} |
| R2 | R2(min) - {R2(delta)*VDD} | R2(min) |
| V_LEVEL | {1-R1/(R1+R2)}*VDD | {1-R1/(R1+R2)}*VDD |
| V_TARGET | {1+R1/R2}*VTH | {1+R1/R2}*VTH |

|  | BEFORE POWER-UP | AFTER POWER-UP |
|---|---|---|
| VCTRL1 | VSS | VDD |
| VCTRL2 | VDD | VSS |
| R1 | R1(min), R1(min)-{R1(delta)*VDD} | R1(min) |
| R2 | R2(min) | R2(min)-{R2(delta)*VDD}, R2(min) |
| V_TARGET | {1+R1/R2}*VTH | {1+R1/R2}*VTH |

POWER-UP SIGNAL GENERATION CIRCUIT

CROSS-REFERENCE TO RELATED APPLICATIONS

The present application claims priority of Korean Patent Application No. 10-2014-0021933, filed on Feb. 25, 2014, which is incorporated herein by reference in its entirety.

BACKGROUND

1. Field

Various embodiments of the present invention relate to semiconductor design technology, and more particularly, to a power-up signal generation circuit in a semiconductor device.

2. Description of the Related Art

Semiconductor devices, such as a dynamic random access memory (DRAM), generally include a power-up signal generation circuit to secure a stable operation of an internal circuit. When an external power voltage VDD is supplied to a semiconductor device, the external power voltage VDD gradually increases to a target level.

However, if the external power voltage VDD is directly supplied to the internal circuit of the semiconductor device before the external power voltage VDD reaches the target level a latch-up phenomenon may occur. Thus, the semiconductor device may be damaged. To prevent such phenomenon from occurring, a power-up signal generation circuit is included in the semiconductor device. The power-up signal generation circuit activates a power-up signal when the external power voltage VDD reaches the target level to stably operate the internal circuit and initialize the semiconductor device.

FIG. 1 is a circuit diagram illustrating a conventional power-up signal generation circuit, and FIG. 2 shows timing diagrams of an external power voltage VDD and a power-up signal PWRUP in the power-up signal generation circuit shown in FIG. 1.

Referring to FIG. 1, the external power voltage VDD supplied to the power-up signal generation circuit is divided by resistors R11 and R12, and the divided voltage is outputted as a level tracing voltage V_LEVEL. The level tracing voltage V_LEVEL has a voltage level that linearly varies according to a level of the external power voltage VDD.

An NMOS transistor N11 receives the level tracing voltage V_LEVEL through a gate thereof and is turned on more strongly as the level of the external power voltage VDD becomes higher. As the NMOS transistor N11 is turned on more strongly, a detection voltage V_DET becomes lower gradually. When the detection voltage V_DET is lower than a certain level, that is, when the external power voltage VDD becomes higher than a target voltage V_TARGET, the power-up signal PWRUP is activated to a logic high level by an inverter.

Referring to FIG. 2, a variation of the power-up signal PWRUP based on variation of the external power voltage VDD is described herein, along with the concerns of the conventional technology for the power-up signal PWRUP.

In a duration prior to a time "t1" the external power voltage VDD, which is applied to a circuit to turn on the power of a semiconductor device, is gradually increased. However, since the external power voltage VDD has not yet reached the target voltage V_TARGET, the power-up signal PWRUP is in a deactivated state of a logic low level.

In a duration between the time "t1" and a time "t2", the external power voltage VDD is increased higher than the target voltage V_TARGET. The NMOS transistor N11 is strongly turned on to enable the power-up signal PWRUP to a logic high level.

In a duration between the time "t2" and a time "t3", the current consumption amount of the semiconductor device is increased and the external power voltage VDD drops. For example, such a voltage drop may occur when a DRAM device performs an active operation "ACT". When the external power voltage VDD drops lower than the target voltage V_TARGET, the detection voltage V_DET may be raised. When the detection voltage V_DET is raised and then drops, the power-up signal PWRUP is reset "RESET" and as a result the semiconductor device in the middle of an operation may be inadvertently initialized again.

SUMMARY

Various embodiments of the present invention are directed to a power-up signal generation circuit: of a semiconductor device capable of stably operating by generating a power-up signal in a state in which a voltage level of an external power voltage sufficiently rises by adjusting a level tracing voltage and increasing a voltage level of a target voltage before a power-up.

Various embodiments of the present invention are directed to a power-up signal generation circuit of a semiconductor device capable of preventing an initialization of an operating semiconductor device by adjusting a level tracing voltage and decreasing a voltage level of a target voltage after a power-up.

In accordance with an embodiment of the present invention, a power-up signal generation circuit may include: a control signal generation unit suitable for generating first and second control voltages based on a power-up signal; a level tracing voltage generation unit suitable for generating a level tracing voltage whose voltage level varies based on the first and second control voltages; and a power-up signal generation unit suitable for generating the power-up signal based on the level tracing voltage, and providing a feedback on the power-up signal to the control signal generation unit.

DETAILED DESCRIPTION

Figure 1:
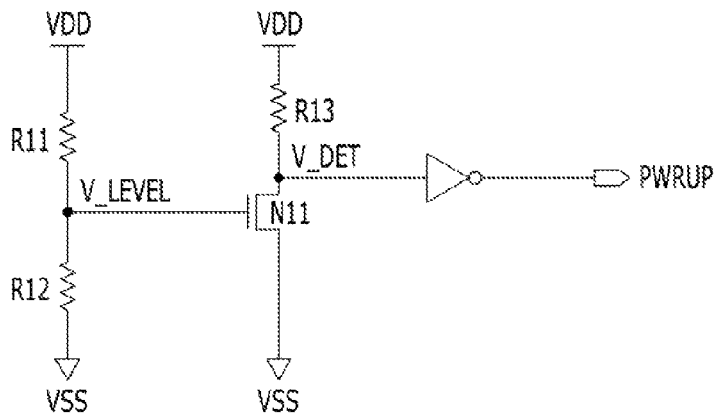
FIG. 1 is a circuit diagram illustrating a conventional power-up signal generation circuit.
Figure 2:
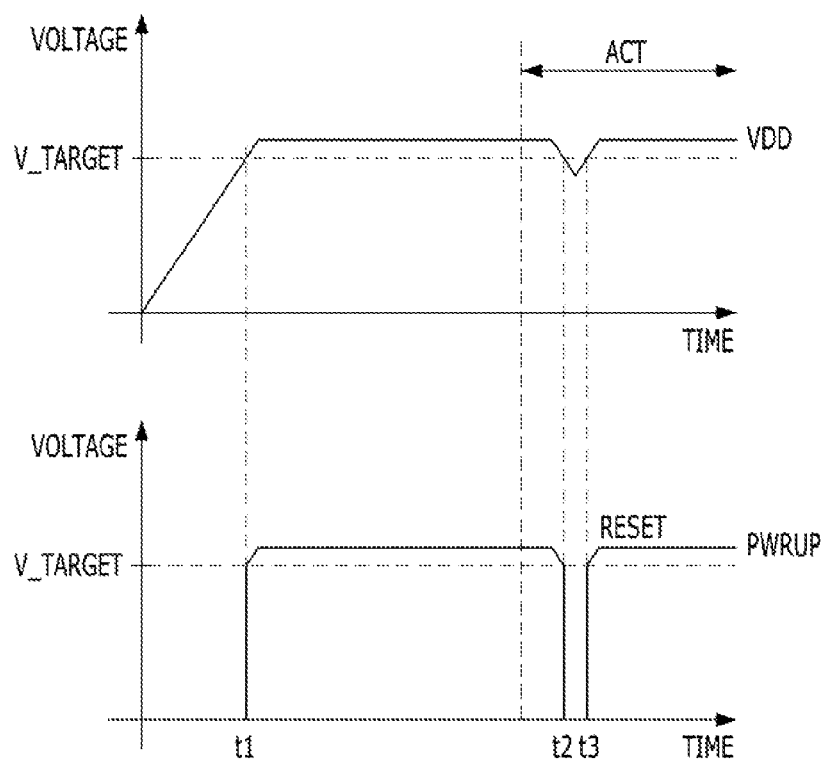
FIG. 2 is a timing diagram of a power-up signal generation circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The drawings are not necessarily to scale and in some instances, proportions may have been exaggerated to clearly illustrate features of the embodiments. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
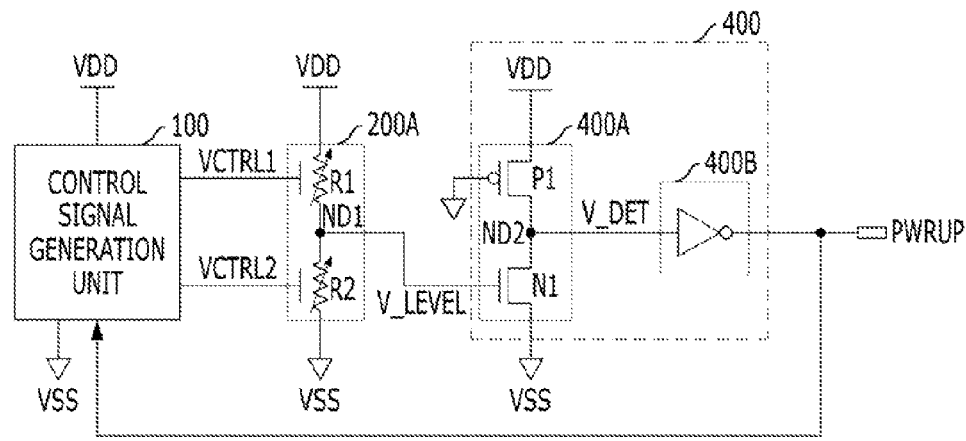
FIG. 3 is a diagram illustrating a power-up signal generation circuit in accordance with an embodiment of the present invention.

FIG. 3 is a diagram illustrating a power-up signal generation circuit in accordance with an embodiment of the present invention.

Referring to FIG. 3, the power-up signal generation circuit may include a control signal generation unit 100, a level tracing voltage generation unit 200A and a power-up signal generation unit 400.

The control signal generation unit 100 generates first and second control voltages VCTRL1 and VCTRL2 based on a power-up signal PWRUP. The control signal generation unit 100 performs an initialization operation. That is, before a power-up the control signal generation unit 100 outputs a ground voltage VSS as the first control voltage VCTRL1 and outputs a supply voltage VDD as the second control voltage VCTRL2. Further, after the power-up, the control signal generation unit 100 inverts and outputs voltage levels of the first and second control voltages VCTRL1 and VCTRL2 at its output node whenever the power-up signal PWRUP toggles from a logic low level to a logic high level.

Here, "before the power-up" means a duration in which the power-up signal PWRUP is deactivated to a logic low level, and "after the power-up" means a duration in which the power-up signal PWRUP is activated to a logic high level.

The level tracing voltage generation unit 200A generates a level tracing voltage V_LEVEL by dividing the supply voltage VDD based on the first and second control voltages VCTRL1 and VCTRL2. The level tracing voltage generation unit 200A may include first and second variable resistors R1 and R2 coupled in series between a supply voltage (VDD) terminal and a ground voltage (VSS) terminal.

The level tracing voltage V_LEVEL controls a target voltage V_TARGET for determining an activation timing of the power-up signal PWRUP.

Before the power-up, the power-up signal PWRUP is controlled to be activated after the supply voltage VDD becomes higher than the target voltage V_TARGET. Before the power-up, the target voltage V_TARGET may be set relatively high to activate the power-up signal PWRUP relatively later. After the power-up, the target voltage V_TARGET may be set relatively low so that a reset of the power-up signal PWRUP rarely occurs. In the embodiment of the present invention, the level tracing voltage generation unit 200A controls the level tracing voltage V_LEVEL. That is, the level tracing voltage generation unit 200A outputs the level tracing voltage V_LEVEL having a relatively low voltage level at a first node ND1 before the power-up, and outputs the level tracing voltage V_LEVEL having a relatively high voltage level at the first node ND1 after the power-up.

The power-up signal generation unit 400 generates the power-up signal PWRUP based on the level tracing voltage V_LEVEL. A feedback on the power-up signal PWRUP generated from the power-up signal generation unit 400 is given to the control signal generation unit 100.

The power-up signal generation unit 400 may include a detection voltage generation section 400A and a power-up signal output section 400B. The detection voltage generation section 400A generates a detection voltage V_DET with a voltage level controlled based on the level tracing voltage V_LEVEL. The power-up signal output section 400B outputs the power-up signal PWRUP based on the detection voltage V_DET.

The detection voltage generation section 400A includes a PMOS transistor P1 and a NMOS transistor N1 coupled in series between the supply voltage (VDD) terminal and the ground voltage (VSS) terminal. The PMOS transistor P1 is coupled between the supply voltage (VDD) terminal and a second node ND2, and has a gate receiving the ground voltage VSS. Since the PMOS transistor P1 is turned on by the ground voltage VSS applied to its gate, an initial voltage level of the second node ND2 maintains a supply voltage (VDD) level. The NMOS transistor N1 is coupled between the second node ND2 and the ground voltage (VSS) terminal, and has a gate receiving the level tracing voltage V_LEVEL. The detection voltage V_DET is outputted through the second node ND2. Since the extent of the turn-on of the NMOS transistor N1 is determined based on the level tracing voltage V_LEVEL applied to its gate, the detection voltage V_DET may have a voltage level controlled by the level tracing voltage V_LEVEL.

The power-up signal output section 400B may change a logic level of the power-up signal PWRUP when the detection voltage V_DET has a level higher that a logic threshold value of an inverter.

Figure 4:
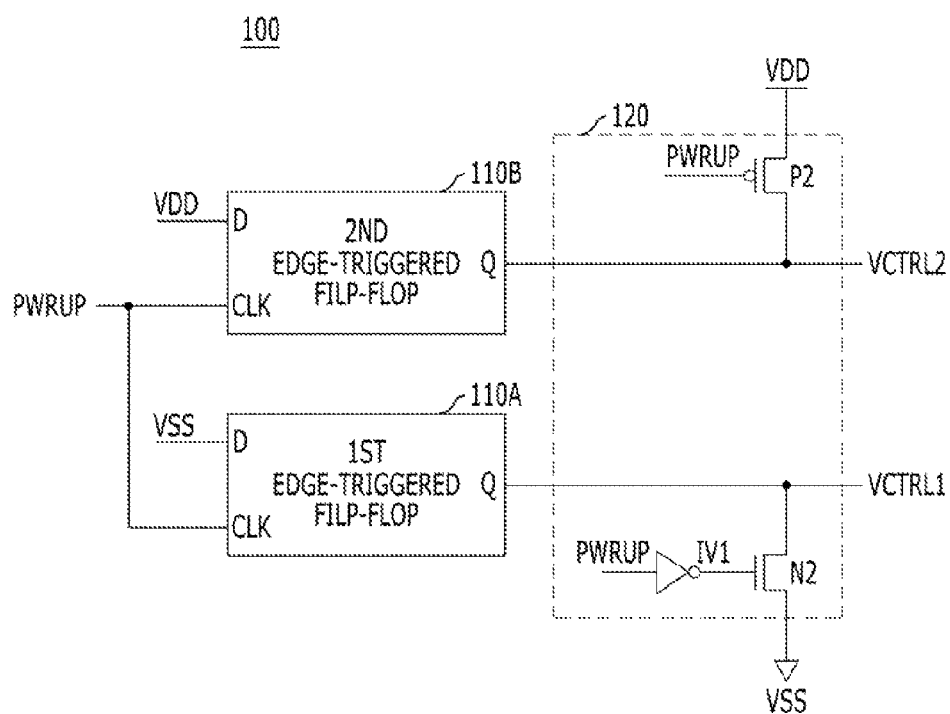
FIG. 4 is a detailed diagram of a control signal generation unit shown in FIG. 3.

FIG. 4 is a detailed diagram of the control signal generation unit 100 shown in FIG. 3.

Referring to FIG. 4, the control signal generation unit 100 may include a first edge-triggered flip-flop 110A, a second edge-triggered flip-flop 110B and an initialization section 120.

The first and second edge-triggered flip-flops 110A and 110B generate the first and second control voltages VCTRL1 and VCTRL2, respectively, based on the power-up signal PWRUP. The first and second edge-triggered flip-flops 110A and 110B are disabled before the power-up, and invert and output the voltage levels of the first and second control voltages VCTRL1 and VCTRL2, respectively, whenever the power-up signal PWRUP toggles from a logic low level to a logic high level.

The first edge-triggered flip-flop 110A may include a rising-edge-triggered flip-flop which inverts and outputs the voltage level of the first control voltage VCTRL1 at its output terminal Q whenever the power-up signal PWRUP toggles from a logic low level to a logic high level. That is, the ground voltage VSS is inputted to the first edge-triggered flip-flop 110A through its data input terminal D, and the power-up signal PWRUP is inputted to the first edge-triggered flip-flop 110A through its clock terminal CLK. The second edge-triggered flip-flop 1108 may include a rising-edge-triggered flip-flop which inverts and outputs the voltage level of the second control voltage VCTRL2 at its output terminal Q whenever the power-up signal PWRUP toggles from a logic low level to a logic high level. That is, the supply voltage VDD is inputted to the second edge-triggered flip-flop 1108 through its data input terminal D, and the power-up signal PWRUP is inputted to the second edge-triggered flip-flop 1108 through its clock terminal CLK.

The initialization section 120 initializes the first control voltage VCTRL1 to the ground voltage VSS and the second control voltage VCTRL2 to the supply voltage VDD before the power-up, that is, before the power-up signal PWRUP reaches a given voltage level. The initialization section 120 includes a PMOS transistor P2 and an NMOS transistor N2. The PMOS transistor P2 is coupled between the supply voltage (VDD) terminal and the output node of the second edge-triggered flip-flop 110B, and has a gate receiving the power-up signal PWRUP. The NMOS transistor N2 is coupled between the output node of the first edge-triggered flip-flop 110A and the ground voltage (VSS) terminal, and has a gate receiving an inverted signal of the power-up signal PWRUP through an inverter IV1.

Accordingly, the PMOS transistor P2 and the NMOS transistor N2 of the initialization section 120 are turned on to initialize the first control voltage VCTRL1 to the ground voltage VSS and the second control voltage VCTRL2 to the supply voltage VDD before the power-up, respectively. The PMOS transistor P2 and the NMOS transistor N2 are turned off after the power-up.

Figures 5, 6:
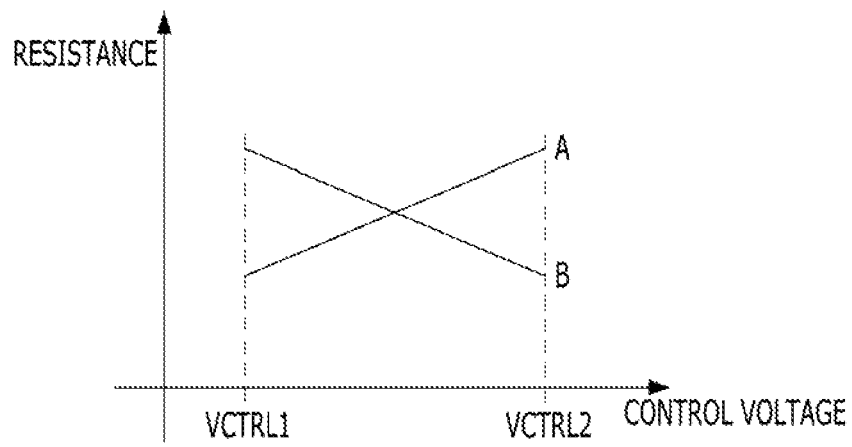
FIG. 5 is a graph illustrating a resistance characteristic of a variable resistor according to a control voltage.
FIG. 6 is a table showing parameters for describing an operation of the power-up signal generation circuit shown in FIG. 3.

FIG. 5 is a graph showing a resistance characteristic of a variable resistor according to a control voltage.

Referring to FIG. 5, a variable resistor "A" has a positive coefficient to the control voltage that is a directly proportional relationship. The resistance of the variable resistor "A" increases as a voltage level of the control voltage changes into a second level VCTRL2 from a first level VCTRL1. A variable resistor "B" has a negative coefficient to the control voltage, that is, an inversely proportional relationship. The resistance of the variable resistor "B'" decreases as the voltage level of the control voltage changes into the second level VCTRL2 from the first level VCTRL1.

In the embodiment of the present invention, the first and second variable resistors R1 and R2 provided in the level tracing voltage generation unit 200A may be the variable resistor "B" which has the negative coefficient to the control voltage, that is, an inversely proportional relationship. However, the present invention is not limited to this structure, and the first and second variable resistors R1 and R2 may be the variable resistor "A" which has the positive coefficient to the control voltage, that is, a directly proportional relationship).

Hereinafter, an operation of the power-up signal generation circuit of FIG. 3 will be described with reference to FIGS. 3, 4, 6 and 7.

Figure 7:
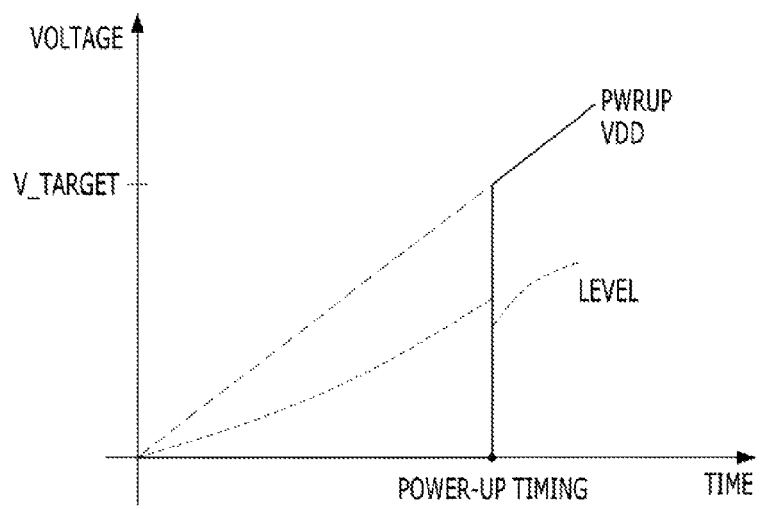
FIG. 7 is a waveform diagram showing voltages varying before and after a power-up in the power-up signal generation circuit shown in FIG. 3.

FIG. 6 is a table showing parameters for describing an operation of the power-up signal generation circuit of FIG. 3, such as VCTRL1, VCTRL2, R1, R2, V_LEVEL and V_TARGET. FIG. 7 is a waveform diagram showing voltages varying before and after the power-up in the power-up signal generation circuit shown in FIG. 3.

Referring to FIGS. 3 and 6, before the power-up, the resistance of the first variable resistor R1 is controlled to have a minimum value R1(min) in response to the first control voltage VCTRL1 having a ground voltage (VSS) level, and the resistance of the second variable resistor R2 is controlled to have a value [R2(min)−{R2(delta)*VDDH}] smaller than the resistance of the first variable resistor R1, in response to the second control voltage VCTRL2 having a supply voltage (VDD) level.

As the resistance of the second variable resistor R2 is smaller than the resistance of the first variable resistor R1 before the power-up, the level tracing voltage V_LEVEL at the first node ND1, which is set to $\{1-R1/(R1+R2)\}*VDD$, becomes lower. Since the NMOS transistor N1 is weakly turned on based on the level tracing voltage V_LEVEL becoming lower, the voltage level of the detection voltage V_DET at the second node ND2 becomes higher. Accordingly, the power-up signal PWRUP is deactivated to a logic low level in response to the voltage level of the detection voltage V_DET becoming higher.

That is, referring to FIG. 7, before the power-up, the level tracing voltage V_LEVEL having a lower voltage level is outputted at the first node ND1 so that the power-up signal PWRUP is activated after the supply voltage VDD becomes higher than the target voltage V_TARGET. Accordingly, the power-up timing when the supply voltage VDD reaches the voltage level of the target voltage V_TARGET may be adjusted. After the power-up, the resistance of the first variable resistor R1 is controlled to have a minimum value [R1(min)−{R1(delta)*VDD}] in response to the first control voltage VCTRL1 having the supply voltage (VDD) level, and the resistance of the second variable resistor R2 is controlled to have a value R2(min) greater than the resistance of the first variable resistor R1, in response to the second control voltage VCTRL2 having the ground voltage (VSS) level.

As the resistance of the second variable resistor R2 is greater than the resistance of the first variable resistor R1 after the power-up, the level tracing voltage V_LEVEL at the first node ND1, which is set to $\{1-R1/(R1+R2)\}*VDD$, becomes higher. Since the NMOS transistor N1 is strongly turned on in response to the level tracing voltage V_LEVEL becoming higher, the voltage level of the detection voltage V_DET at the second node ND2 becomes lower. Accordingly, the power-up signal PWRUP is activated to a logic high level in response to the voltage level of the detection voltage V_DET becoming lower.

That is, referring to FIG. 7, after the power-up, the level tracing voltage V_LEVEL having a higher voltage level is outputted through the first node ND1 to control the target voltage V_TARGET to be lower, so that a reset of the power-up signal PWRUP rarely occurs.

Figure 8:
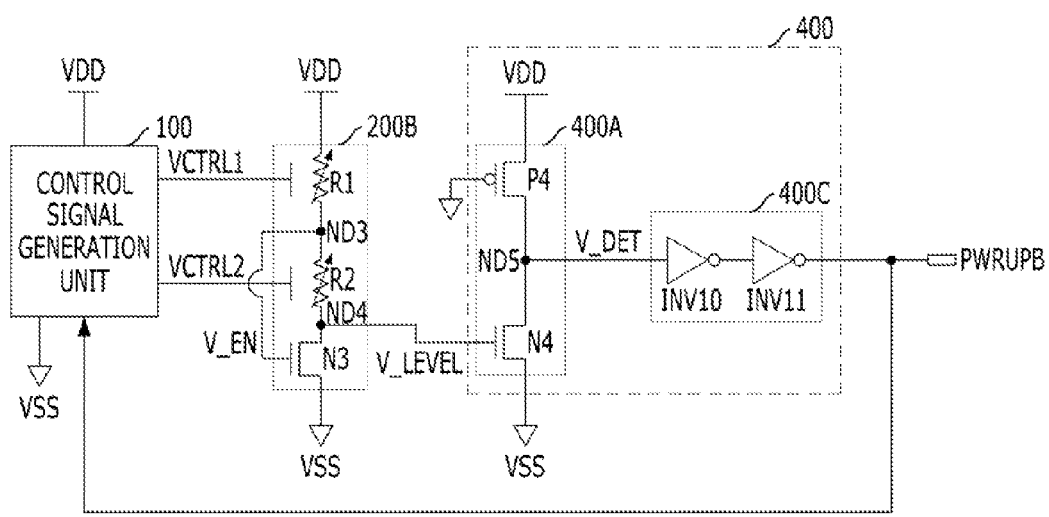
FIG. 8 is a diagram illustrating a power-up signal generation circuit in accordance with an embodiment of the present invention.

FIG. 8 is a diagram illustrating a power-up signal generation circuit in accordance with an embodiment of the present invention.

Referring to FIG. 8, the power-up signal generation circuit may include the control signal generation unit 100, a level tracing voltage generation unit 200B and the power-up signal generation unit 400.

The level tracing voltage generation unit 200B may include a voltage divider having the first and second variable resistors R1 and R2 of FIG. 3 and a compensation section. The compensation section may include a NMS transistor N3.

The control signal generation unit 100 generates first and second control voltages VCTRL1 and VCTRL2 in response to a power-up signal PWRUPB. The control signal generation unit 100 performs an initialization operation. That is, the control signal generation unit 100 outputs a supply voltage VDD as the first control voltage VCTRL1 and outputs a ground voltage VSS as the second control voltage VCTRL2 before a power-up. Further, after the power-up, the control signal generation unit 100 inverts and outputs voltage levels of the first and second control voltages VCTRL1 and VCTRL2 at its output node whenever the power-up signal PWRUPB toggles to a logic low level from a logic high level.

Here, "before the power-up" means a duration in which the power-up signal PWRUPB is deactivated to a level corresponding to the supply voltage VDD, and "after the power-up" means a duration that the power-up signal PWRUPB is activated to a logic low level.

The level tracing voltage generation unit 200B generates a level tracing voltage V_LEVEL by dividing the supply voltage VDD and the ground voltage VSS in response to the first and second control voltages VCTRL1 and VCTRL2. The level tracing voltage generation unit 200B may include first and second variable resistors R1 and R2 coupled between a supply voltage (VDD) terminal and a ground voltage (VSS) terminal in series.

The level tracing voltage generation unit 200B in accordance with the embodiment of the present invention may further include the compensation section that compensates for the level tracing voltage V_LEVEL changing according to the environment condition. The environment condition may vary according to process, voltage and temperature (PVT).

The compensation section may include the NMOS transistor N3 which serves as a current source. The NMOS transistor N3 is coupled between the second variable resistor R2 and the ground voltage (VSS) terminal, and has a gate receiving an enable signal V_EN, which is outputted at a third node ND3 between the first variable resistor R1 and the second variable resistor R2. The extent of the turn-on of the NMOS transistor N3 is controlled in response to a voltage level V_EN of the third node ND3. When the voltage level V_EN of the third node ND3 is lower than a threshold voltage (Vth) of the NMOS transistor N3, no current flows through the NMOS transistor N3. When the threshold voltage (Vth) of the NMOS transistor N3 becomes lower, the voltage level V_EN of the third node ND3 becomes lower and the NMOS transistor N3 compensates the voltage level V_EN of the third node ND3. That is, the NMOS transistor N3 compensates a process variation. When the threshold voltage (Vth) of the NMOS transistor N3 becomes lower, a current flowing in the first and second variable resistors R1 and R2 is greater, so that the voltage level of the enable signal V_EN is lower.

The level tracing voltage V_LEVEL is used to control a target voltage V_TARGET for determining an activation timing of the power-up signal PWRUPB.

In the embodiment of the present invention, before the power-up, the power-up signal PWRUPB may be activated to a logic low level after the supply voltage VDD becomes higher than the target voltage V_TARGET. Before the power-up, the target voltage V_TARGET may be set relatively high so as to activate the power-up signal PWRUPB relatively later. Accordingly, the level tracing voltage generation unit 200B controls the level tracing voltage V_LEVEL to have a higher voltage level before the power-up. After the power-up, the target voltage V_TARGET may be set relatively low so that a reset of the power-up signal PWRUPB rarely occurs. Accordingly, the level tracing voltage generation unit 200B controls the level tracing voltage V_LEVEL to have a lower voltage level after the power-up.

The power-up signal generation unit 400 generates the power-up signal PWRUPB based on the level tracing voltage V_LEVEL. A feedback on the power-up signal PWRUPB generated from the power-up signal generation unit 400 is given to the control signal generation unit 100.

The power-up signal generation unit 400 may include the detection voltage generation section 400A and a power-up signal output section 400C. The detection voltage generation section 400A generates a detection voltage V_DET with a voltage level controlled in response to the level tracing voltage V_LEVEL. The power-up signal output section 400C outputs the power-up signal PWRUPB based on the detection voltage V_DET.

The detection voltage generation section 400A includes a PMOS transistor P4 and an NMOS transistor N4 coupled between the supply voltage (VDD) terminal and the ground voltage (VSS) terminal in series. The PMOS transistor P4 is coupled between the supply voltage (VDD) terminal and a fifth node ND5, and has a gate for receiving the ground voltage VSS. Since the PMOS transistor P4 is turned on by the ground voltage VSS applied to its gate, an initial voltage level of the fifth node ND5 maintains a supply voltage (VDD) level. The NMOS transistor N4 is coupled between the fifth node ND5 and the ground voltage (VSS) terminal, and has a gate receiving the level tracing voltage V_LEVEL. The detection voltage V_DET is outputted through the fifth node ND5. Since the extent of the turn-on of the NMOS transistor N4 is determined based on the level tracing voltage V_LEVEL applied to its gate, the detection voltage V_DET may have a voltage level controlled by the level tracing voltage V_LEVEL.

The power-up signal output section 400C may change a logic level of the power-up signal PWRUPB when the detection voltage V_DET has a level higher than a logic threshold value of an inverter INV10. The power-up signal output section 400C may include the inverter INV10 and an inverter INV11, which are connected in series, to output the power-up signal PWRUPB.

Figures 9, 10:
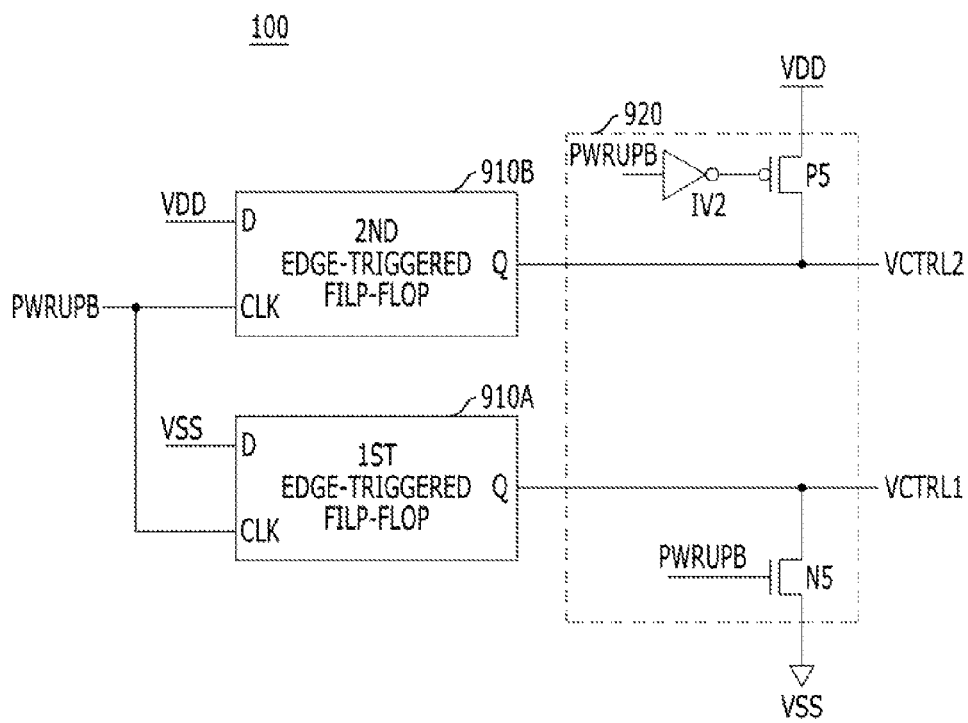
FIG. 9 is a detailed diagram of a control signal generation unit shown in FIG. 8.
FIG. 10 is a table showing parameters for describing an operation of the power-up signal generation circuit shown in FIG. 8.

FIG. 9 is a detailed diagram of the control signal generation unit 100 shown in FIG. 8.

Referring to FIG. 9, the control signal generation unit 100 may include a first edge-triggered flip-flop 910A, a second edge-triggered flip-flop 910B and an initialization section 920.

The first and second edge-triggered flip-flops 910A and 910B generate the first and second control voltages VCTRL1 and VCTRL2, respectively, in response to the power-up signal PWRUPB. The first and second edge-triggered flip-flops 910A and 910B are disabled before the power-up, and invert and output the voltage levels of the first and second control voltages VCTRL1 and VCTRL2, respectively, whenever the power-up signal PWRUPB toggles to a logic low level from a logic high level.

The first edge-triggered flip-flop 910A may include a falling-edge-triggered flip-flop which inverts and outputs the voltage level of the first control voltage VCTRL1 at its output terminal Q whenever the power-up signal PWRUPB toggles to a logic low level from a logic high level. That is, the ground voltage VSS is inputted to the first edge-triggered flip-flop 910A through its data input terminal D, and the power-up signal PWRUPB is inputted to the first edge-triggered flip-flop 910A through its clock terminal CLK. The second edge-triggered flip-flop 910B may include a falling-edge-triggered flip-flop which inverts and outputs the voltage level of the second control voltage VCTRL2 at its output terminal Q whenever the power-up signal PWRUPB toggles from a logic high level to a logic low level. That is, the supply voltage VDD is inputted to the second edge-triggered flip-flop 910B through its data input terminal D, and the power-up signal PWRUPB is inputted to the second edge-triggered flip-flop 910B through its clock terminal CLK.

The initialization section 920 initializes the first control voltage VCTRL1 to the supply voltage VDD and the second control voltage VCTRL2 to the ground voltage VSS when the power-up signal PWRUPB is in a deactivated state, that is, before the power-up. The initialization section 920 may include an NMOS transistor N5 and a PMOS transistor P5. The PMOS transistor P5 is coupled between the supply voltage (VDD) terminal and the output node of the first edge-triggered flip-flop 910A, and has a gate receiving the power-up signal PWRUPB inverted. The NMOS transistor N5 is coupled between the output node of the second edge-triggered flip-flop 910B and the ground voltage (VSS) terminal, and has a gate for receiving an inverted signal of the power-up signal PWRUPB through an inverter IV2.

Accordingly, the PMOS transistor P5 and the NMOS transistor N5 of the initialization section 920 are turned on to initialize the first control voltage VCTRL1 to the supply voltage VDD and the second control voltage VCTRL2 to the ground voltage VSS before the power-up, respectively. The PMOS transistor P5 and the NMOS transistor N5 are turned off after the power-up.

Hereinafter, an operation of the power-up signal generation circuit of FIG. 8 will be described with reference to FIGS. 8 to 11.

Figure 11:
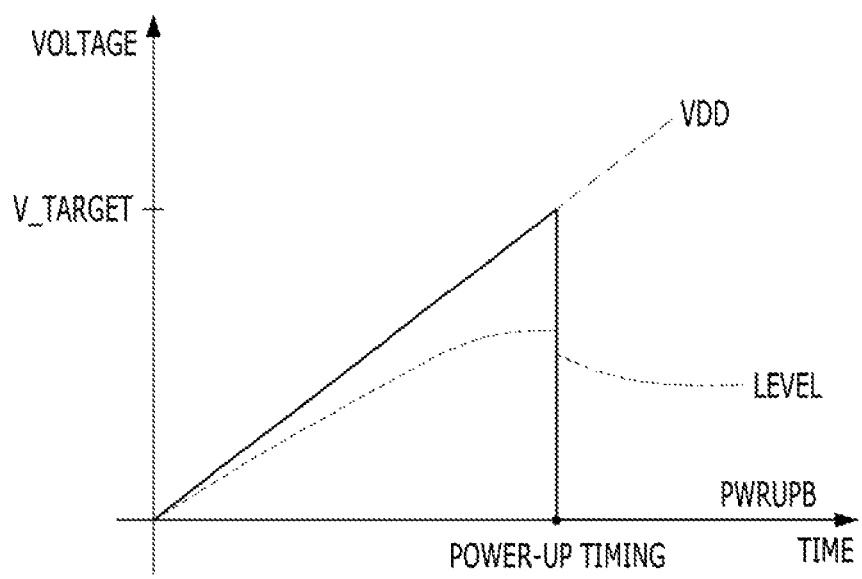
FIG. 11 is a waveform diagram illustrating a voltage varying before and after a power-up in the power-up signal generation circuit shown in FIG. 8.

FIG. 10 is a table showing parameters for describing an operation of the power-up signal generation circuit shown in FIG. 8, such as VCTRL1, VCTRL2, R1, R2, V_LEVEL and V_TARGET. FIG. 11 is a waveform diagram showing voltages varying before and after the power-up in the power-up signal generation circuit shown in FIG. 8.

Referring to FIGS. 8 and 10, before the power-up, the resistance of the first variable resistor R1 is controlled to have a minimum value [R1(min)−{R1(delta)*VDD}] in response to the first control voltage VCTRL1 having a supply voltage (VDD) level, and the resistance of the second variable resistor R2 is controlled to have a value R2(min) greater than the resistance of the first variable resistor R1, in response to the second control voltage VCTRL2 having a ground voltage (VSS) level.

As the resistance of the second variable resistor R2 is greater than the resistance of the first variable resistor R1 before the power-up, the level tracing voltage V_LEVEL at the fourth node ND4 becomes higher. Since the NMOS transistor N4 is strongly turned on in response to the level tracing voltage V_LEVEL becoming higher, the voltage level of the detection voltage V_DET at the fifth node ND5 becomes lower. Accordingly, the power-up signal PWRUPB is deactivated to a logic high level in response to the voltage level of the detection voltage V_DET becoming lower.

That is, referring to FIG. 11, before the power-up, the level tracing voltage V_LEVEL having a higher voltage level is outputted at the fourth node ND4 so that the power-up signal PWRUPB is activated to a logic low level after the supply voltage VDD becomes higher than the target voltage V_TARGET. Accordingly, the power-up timing when the supply voltage VDD reaches the voltage level of the target voltage V_TARGET may be adjusted.

After the power-up, the resistance of the first variable resistor R1 is controlled to have a minimum value R1(min) in response to the first control voltage VCTRL1 having the ground voltage (VSS) level, and the resistance of the second variable resistor R2 is controlled to have a value [R2(min)−{R2(delta)*VDD}] smaller than the resistance of the first variable resistor R1, in response to the second control voltage VCTRL2 having the supply voltage (VDD) level.

As the resistance of the second variable resistor R2 is smaller than the resistance of the first variable resistor R1 after the power-up, the level tracing voltage V_LEVEL at the fourth node ND4 becomes lower. Since the NMOS transistor N4 is weakly turned on in response to the level tracing voltage V_LEVEL becoming lower, the voltage level of the detection voltage V_DET at the fifth node ND5 becomes higher. Accordingly, the power-up signal PWRUPB is activated to a logic low level in response to the voltage level of the detection voltage V_DET becoming higher.

That is, referring to FIG. 11, after the power-up, the level tracing voltage V_LEVEL having a lower voltage level is outputted through the fourth node ND4 to control the target voltage V_TARGET to be lower so that a reset of the power-up signal PWRUPB rarely occurs.

According to the embodiments of the present invention as described above, the power-up signal generation unit may generate a power-up signal when a voltage level of an external power voltage sufficiently rises by adjusting a level tracing voltage and increasing a voltage level of a target voltage before a power-up. Accordingly, the reliability on an overall operation of a semiconductor device may be improved.

Furthermore, according to the embodiments of the present invention as described above, the power-up signal generation unit may prevent an inadvertent reset of an operating semiconductor device by adjusting a level tracing voltage and decreasing a voltage level of a target voltage after a power-up.

While the present invention has been described with respect to the specific embodiments, it will be apparent to those skilled in the art that various changes and modifications may be made without departing from the spirit and scope of the invention as defined in the following claims.

For instance, positions and kinds of the logic gates and transistors exemplified in the above-described embodiment should be differently implemented according to the polarities of the signals input thereto.

What is claimed is:

1. A power-up signal generation circuit comprising:
   a control signal generation unit suitable for generating first and second control voltages based on a power-up signal;
   a level tracing voltage generation unit suitable for generating a level tracing voltage with a voltage level that varies based on the first and second control voltages; and
   a power-up signal generation unit suitable for generating the power-up signal based on the level tracing voltage, and providing feedback on the power-up signal to the control signal generation unit,
   wherein the first control voltage is initialized to a first voltage and the second control voltage is initialized to a second voltage before the power-up signal is activated, and
   wherein the voltage levels of the first and second control voltages are inverted, respectively, whenever the power-up signal toggles after the power-up signal is activated.

2. The power-up signal generation circuit of claim 1, wherein the level tracing voltage generation unit comprises:
   first and second variable resistors coupled in series between a supply voltage terminal and a ground voltage terminal,
   wherein the level tracing voltage is outputted from a first node between the first and second variable resistors.

3. The power-up signal generation circuit of claim 2, wherein a resistance of the first variable resistor is inversely proportional to a voltage level of the first control voltage, and a resistance of the second variable resistor is inversely proportional to a voltage level of the second control voltage.

4. The power-up signal generation circuit of claim 3, wherein, before the power-up signal is activated, the control signal generation unit generates the first control voltage such that the resistance of the first variable resistor is set to a minimum value, and generates the second control voltage such that the resistance of the second variable resistor becomes gradually lower than the resistance of the first variable resistor.

5. The power-up signal generation circuit of claim 3, wherein, after the power-up signal is activated, the control signal generation unit generates the second control voltage such that the resistance of the second variable resistor is set to a minimum value, and generates the first control voltage such that the resistance of the first variable resistor becomes gradually lower than the resistance of the second variable resistor.

6. The power-up signal generation circuit of claim 1, wherein the power-up signal generation unit comprises:
a detection voltage generation section suitable for generating a detection voltage based on the level tracing voltage; and
a power-up signal output section suitable for outputting the power-up signal by inverting the detection voltage.

7. The power-up signal generation circuit of claim 6, wherein the detection voltage generation section comprises a PMOS transistor and a NMOS transistor coupled in series between a supply voltage terminal and a ground voltage terminal,
wherein the detection voltage is outputted from a second node between the PMOS transistor and the NMOS transistor.

8. The power-up signal generation circuit of claim 7, wherein the PMOS transistor maintains a voltage of the second node at a supply voltage level, and the NMOS transistor is turned on based on the level tracing voltage and adjusts the voltage of the second node to have a value between the supply voltage level and a ground voltage level.

9. The power-up signal generation circuit of claim 1, wherein the control signal generation unit generates the first control voltage having a ground voltage level and generates the second control voltage having a supply voltage level before the power-up signal is activated; and
the control signal generation unit inverts and outputs voltage levels of the first and second control voltages when the power-up signal toggles after the power-up signal is activated.

10. The power-up signal generation circuit of claim 9, wherein the control signal generation unit includes:
a first rising edge-triggered flip-flop suitable for receiving a ground voltage at its data input terminal and the power-up signal at its clock terminal, and outputting the first control voltage at its output terminal;
a second rising edge-triggered flip-flop suitable for receiving a supply voltage at its data input terminal and the power-up signal at its clock terminal, and outputting the second control voltage at its output terminal; and
an initialization section suitable for initializing the first control voltage to the ground voltage and the second control voltage to the supply voltage before the power-up signal is activated.

11. The power-up signal generation circuit of claim 2, wherein a resistance of the first variable resistor is inversely proportional to a voltage level of the first control voltage, and a resistance of the second variable resistor is inversely proportional to a voltage level of the second control voltage.

12. The power-up signal generation circuit of claim 11, wherein, before the power-up signal is activated, the control signal generation unit generates the second control voltage such that the resistance of the second variable resistor is set to a minimum value, and generates the first control voltage such that the resistance of the first variable resistor gradually becomes lower than the resistance of the second variable resistor.

13. The power-up signal generation circuit of claim 11, wherein, after the power-up signal is activated, the control signal generation unit generates the first control voltage such that the resistance of the first variable resistor is set to a minimum value, and generates the second control voltage such that the resistance of the second variable resistor gradually becomes lower than the resistance of the first variable resistor.

14. The power-up signal generation circuit of claim 1, when the power-up signal is activated, the voltage level of the level tracing voltage is higher than before the power-up signal is activated.

15. A power-up signal generation circuit comprising:
a control signal generation unit suitable for generating first and second control voltages based on a power-up signal;
a level tracing voltage generation unit suitable for generating a level tracing voltage with a voltage level that varies based on the first and second control voltages, wherein, when the power-up signal is activated, the voltage level of the level tracing voltage is higher than before the power-up signal is activated; and
a power-up signal generation unit suitable for generating the power-up signal based on the level tracing voltage, and providing feedback on the power-up signal to the control signal generation unit,
wherein the level tracing voltage generation unit comprises first and second variable resistors and a compensation unit coupled in series between a supply voltage terminal and a ground voltage terminal, and
wherein the compensation unit is enabled based on a voltage level of a third node between the first and second variable resistors, and the level tracing voltage is outputted from a fourth node between the second variable resistor and the compensation unit.

16. A power-up signal generation circuit comprising:
a control signal generation unit suitable for generating first and second control voltages based on a power-up signal;
a level tracing voltage generation unit suitable for generating a level tracing voltage with a voltage level that varies based on the first and second control voltages, wherein, when the power-up signal is activated, the voltage level of the level tracing voltage is higher than before the power-up signal is activated; and
a power-up signal generation unit suitable for generating the power-up signal based on the level tracing voltage, and providing feedback on the power-up signal to the control signal generation unit,
wherein the control signal generation unit generates the first control voltage having a supply voltage level and generates the second control voltage having a ground voltage level before the power-up signal is activated, and the control signal generation unit inverts and outputs voltage levels of the first and second control voltages when the power-up signal toggles after the power-up signal is activated, wherein the control signal generation unit includes:
- a first falling edge-triggered flip-flop suitable for receiving a ground voltage at its data input terminal and the power-up signal at its clock terminal, and outputting the first control voltage at its output terminal;
- a second falling edge-triggered flip-flop suitable for receiving a supply voltage at its data input terminal and the power-up signal at its clock terminal, and outputting the second control voltage at its output terminal; and
- an initialization section suitable for initializing the first control voltage to the ground voltage and the second control voltage to the supply voltage before the power-up signal is activated.

* * * * *